US009606187B2

(12) United States Patent
Choi

(10) Patent No.: US 9,606,187 B2
(45) Date of Patent: Mar. 28, 2017

(54) BATTERY PACK

(71) Applicant: SAMSUNG SDI CO., LTD., Yongin-si, Gyeonggi-do (KR)

(72) Inventor: Youngoh Choi, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 633 days.

(21) Appl. No.: 14/018,390

(22) Filed: Sep. 4, 2013

(65) Prior Publication Data
US 2014/0300364 A1    Oct. 9, 2014

(30) Foreign Application Priority Data

Apr. 5, 2013    (KR) ........................ 10-2013-0037633

(51) Int. Cl.
*H02J 7/04* (2006.01)
*G01R 31/36* (2006.01)
*H04Q 9/00* (2006.01)
*H01M 10/42* (2006.01)

(52) U.S. Cl.
CPC .......... *G01R 31/3627* (2013.01); *H04Q 9/00* (2013.01); *H01M 2010/4278* (2013.01); *H04Q 2209/10* (2013.01); *H04Q 2209/30* (2013.01)

(58) Field of Classification Search
CPC ............ H01M 2010/4278; H04Q 9/00; H04Q 2209/30
USPC ................... 320/107, 134, 165; 324/426, 433
See application file for complete search history.

(56) References Cited

U.S. PATENT DOCUMENTS

| 2011/0012661 A1* | 1/2011 | Binder ................. A63H 33/042 327/276 |
| 2011/0175574 A1 | 7/2011 | Sim et al. |
| 2011/0273023 A1 | 11/2011 | Nishida et al. |
| 2012/0268069 A1* | 10/2012 | Park ................. H01M 10/4207 320/116 |

(Continued)

FOREIGN PATENT DOCUMENTS

| EP | 2 164 127 A1 | 3/2010 |
| JP | 2002-110259 | 4/2002 |

(Continued)

OTHER PUBLICATIONS

EPO Search Report dated Mar. 2, 2015, for corresponding European Patent application 13192243.7, (7 pages).

(Continued)

*Primary Examiner* — Edward Tso
*Assistant Examiner* — Aaron Piggush
(74) *Attorney, Agent, or Firm* — Lewis Roca Rothgerber Christie LLP

(57) ABSTRACT

Provided is a battery pack, which can prevent a plurality of battery modules from being abnormally assembled. The battery pack may include n battery modules; n slave battery management systems (BMSs) corresponding to the n battery modules, the n slave BMSs respectively and sequentially coupled to each other; and a master BMS coupled to the n slave BMSs. Here, the master BMS is configured to apply a trigger signal to a first slave BMS, the first to (n−1)th slave BMSs are configured to transmit the trigger signal and first to (n−1)th signals, which are different from each other, to a next slave BMS, an nth slave BMS is configured to transmit an nth signal to the master BMS.

12 Claims, 7 Drawing Sheets

(56) References Cited

U.S. PATENT DOCUMENTS

2013/0066572 A1    3/2013    Terashima et al.

FOREIGN PATENT DOCUMENTS

| JP | 2011-182558 A | 9/2011 |
| JP | 2012-099997 A | 5/2012 |
| KR | 10-2011-0013747 A | 2/2011 |
| KR | 10-2011-0092289 | 8/2011 |
| KR | 10-2012-0037163 A | 4/2012 |

OTHER PUBLICATIONS

KIPO Office action dated Apr. 21, 2016, for Korean priority Patent application 10-2013-0037633, (8 pages).
KIPO Office Action dated Jan. 6, 2017, for corresponding Korean Patent Application No. 10-2013-0037633 (7 pages).

* cited by examiner

BATTERY PACK

CROSS-REFERENCE TO RELATED APPLICATION

This application claims priority to and the benefit of Korean Patent Application No. 10-2013-0037633, filed on Apr. 5, 2013, the entire content of which is incorporated herein by reference.

BACKGROUND

1. Field

Aspects of the present invention relate to a battery pack, which is capable of preventing a plurality of battery modules from being abnormally assembled.

2. Description of the Related Art

Secondary batteries are widely applied in portable devices and electric vehicles (EVs) or hybrid vehicles (HVs) driven by electric driving sources. In electric vehicles, in order to obtain a desired output power level for secondary batteries, a plurality of battery cells are connected to each other to be used as a power source.

To this end, a battery module is formed using a plurality of battery cells and a plurality of battery modules are combined with each other to form a battery pack to be used as the power source.

However, because the respective battery cells may not be the same with each other in view of their respective charge and discharge characteristics, cell balancing is performed, for example, during charging and discharging. In this regard, battery modules including a battery pack should be accurately combined with each other to achieve accurate cell balancing.

SUMMARY

Aspects of the present invention provide a battery pack, which is capable of preventing a plurality of battery modules from being abnormally assembled.

In accordance with one aspect of the present invention, there is provided a battery pack, the battery pack including: n battery modules; n slave battery management systems corresponding to the n battery modules, the n slave battery management systems respectively and sequentially coupled to each other; and a master battery management system coupled to the n slave battery management systems. Here, the master battery management system is configured to apply a trigger signal to a first slave battery management system of the n slave battery management systems, the first to (n−1)th slave battery management systems are configured to transmit the trigger signal and first to (n−1)th signals, which are different from each other, to a next slave battery management system of the n slave battery management systems, an nth slave battery management system of the n slave battery management systems is configured to transmit an nth signal to the master battery management system, and n is an integer greater than or equal to two.

The master battery management system may be configured to compare the nth signal with a reference value and to determine the n battery modules are normally connected when the nth signal is equal to the reference value.

The master battery management system may be configured to compare the nth signal with a reference value and to determine that the n battery modules are abnormally connected when the nth signal is not equal to the reference value.

The first slave battery management system may be configured to pre-store the trigger signal of the master battery management system as a reference value, and the second to nth slave battery management systems may be configured to pre-store input signals to be applied from a preceding slave battery management system of the n slave battery management systems as reference values.

The first to nth slave battery management systems may be configured to compare input signals applied from the master battery management system or the preceding slave battery management system with the reference values.

The first to nth slave battery management systems may be configured transmit an error signal to the master battery management system when the input signals are not equal to the reference values.

When the input signals are not equal to the reference values, the first to (n−1)th slave battery management systems may be configured to transmit an error signal to the next slave battery management system, and the nth slave battery management system connected at a last stage is configured to transmit the error signal to the master battery management system.

The first to (n−1)th slave battery management systems may be configured to transmit no signal to the next slave battery management system when the input signals are not equal to the reference values.

The battery pack of claim 8, wherein after transmitting the trigger signal, the master battery management system may be configured to measure a time duration and to determine that the battery modules are abnormally connected when no signal is received from the n slave battery management systems within a reference time.

The trigger signal and the first to nth signals may have different frequencies.

The first to nth signals may have intrinsic ID values for the respective first to nth slave battery management systems.

The first signal may be an inversion signal of the trigger signal, and the second to nth signals may be inversion signals of preceding signals.

Additional aspects and/or features of the invention will be described, in part, in the description which follows and, in part, will be apparent from the description, or may be learned by practice of the invention.

BRIEF DESCRIPTION OF THE DRAWINGS

Features and aspects of the present invention will be more apparent from the following detailed description in conjunction with the accompanying drawings, in which.

DETAILED DESCRIPTION

Hereinafter, examples of embodiments of the invention will be described in detail with reference to the accompanying drawings such that they may easily be made and used by those skilled in the art.

Figure 1:
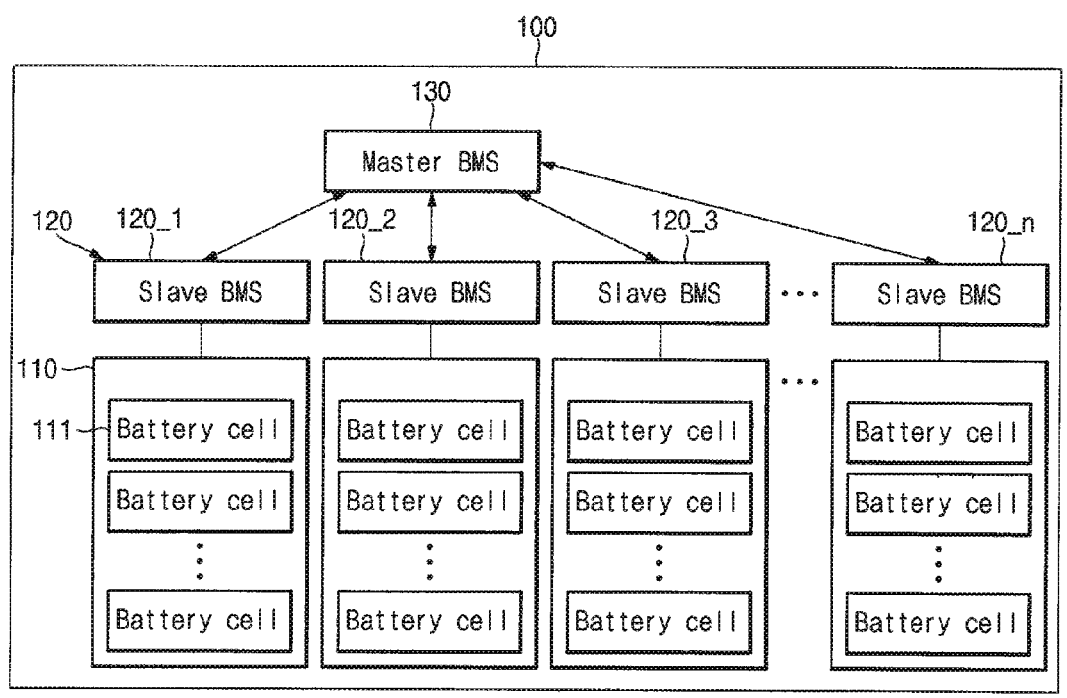
FIG. 1 is a schematic diagram of a battery pack according to an embodiment of the present invention.

FIG. 1 is a schematic diagram of a battery pack according to an embodiment of the present invention.

Referring to FIG. 1, the battery pack 100 according to an embodiment of the present invention includes battery modules 110, a slave battery management system (BMS) assembly 120 connected (or coupled) to the battery modules 110, and a master BMS 130 connected to the slave BMS assembly 120.

The battery pack 100 includes a plurality of battery modules 110 (exemplified as n battery modules in FIG. 1), and each of battery modules 110 may include a plurality of battery cells 111. The battery cells 111 may be secondary batteries, such as lithium ion batteries. In addition, the battery cells 111 may be connected to each other in series or parallel, for example, through a bus bar in one of the battery modules 110.

The number of battery cells 111 of one of the battery modules 110 may be equal to the number of battery cells of another battery module 110. However, in other embodiments, the number of battery cells 111 of one of the battery modules 110 may not be equal to the number of battery cells of other ones of the battery modules 110. For example, one battery module 110 may include 12 battery cells 111, and another battery module 110 may include 10 battery cells 111, so as to have different outputs.

Battery modules 110 should be accurately assembled in a predetermined order (e.g., an order according to the number of battery cells 111) at the time of assembling the battery pack 100. In addition, even if the numbers of the battery cells 111 of the respective battery modules 110 are equal to each other, if the battery modules 110 are assembled in an inaccurate order, unintended cell balancing may be performed when the slave BMS assembly 120 performs cell balancing of the battery cells 111.

The battery pack 100 according to an embodiment of the present invention induces accurate assembling of the battery modules 110 through signal transmission of the slave BMS assembly 120 and the master BMS 130, as will be described below.

According to one embodiment, the slave BMS assembly 120 is provided with the same number (i.e., n) of slave battery management systems (BMSs) as that of the battery modules 110. The first to nth slave battery management systems (BMSs) 120_1 to 120_n, collectively the slave BMS assembly 120, are associated with the battery modules 110 in one-to-one correspondence. The slave BMS assembly 120 may sense telemetry, for example, voltages and temperatures, of the battery cells 111 of a corresponding battery module 110 and may control a balancing operation of the corresponding battery cells 111.

In addition, the slave BMS assembly 120 is connected to the master BMS 130 in a state in which the slave BMSs 120_1 to 120_n are associated with the battery modules 110. In addition, when the slave BMS assembly 120 is initially connected to the master BMS 130 in a normal order, the first slave BMS 120_1 receives a predetermined trigger signal from the master BMS 130 to confirm the normal connection and transmits a first signal to the second slave BMS 120_2, and the second slave BMS 120_2 transmits a second signal different from the first signal to the third slave BMS 120_3. In such a manner, signal transmission is performed to reach the nth slave BMS 120_n. The nth slave BMS 120_n applies an nth signal to the master BMS 130. The master BMS 130 confirms that the slave BMS assembly 120 and the battery modules 110 are connected in the normal order. However, if the slave BMS assembly 120 and the battery modules 110 are not connected in the normal order, an abnormal connection may be identified according to connection order error information included in the signals transmitted from the slave BMSs 120_1 to 120_n to the master BMS 130.

The master BMS 130 is connected to the slave BMS assembly 120. The master BMS 130 performs various functions, for example, controlling relays connected to the battery pack 100, communication with an external device, and driving an actuator of the slave BMS assembly 120 for thermal management. In addition, the master BMS 130 is connected to the slave BMS assembly 120 through a controller area network (CAN) communication to transmit/receive signals.

According to one embodiment, when the master BMS 130 is connected to the slave BMS assembly 120 for the first time, the master BMS 130 transmits a predetermined trigger signal to the slave BMS 120_1 of the first stage. Then, the master BMS 130 confirms whether or not the nth signal is applied to the nth slave BMS 120_n connected at the last stage, thereby determining that the slave BMSs 120_1 to 120_n are connected in the predetermined order. In addition, when the nth signal is not applied to the nth slave BMS 120_n, the master BMS 130 determines that the slave BMSs 120_1 to 120_n are abnormally connected and may inform users of the abnormal connection.

Hereinafter, the operation of connecting the master BMS and the slave BMS will be described in more detail.

Figure 2:
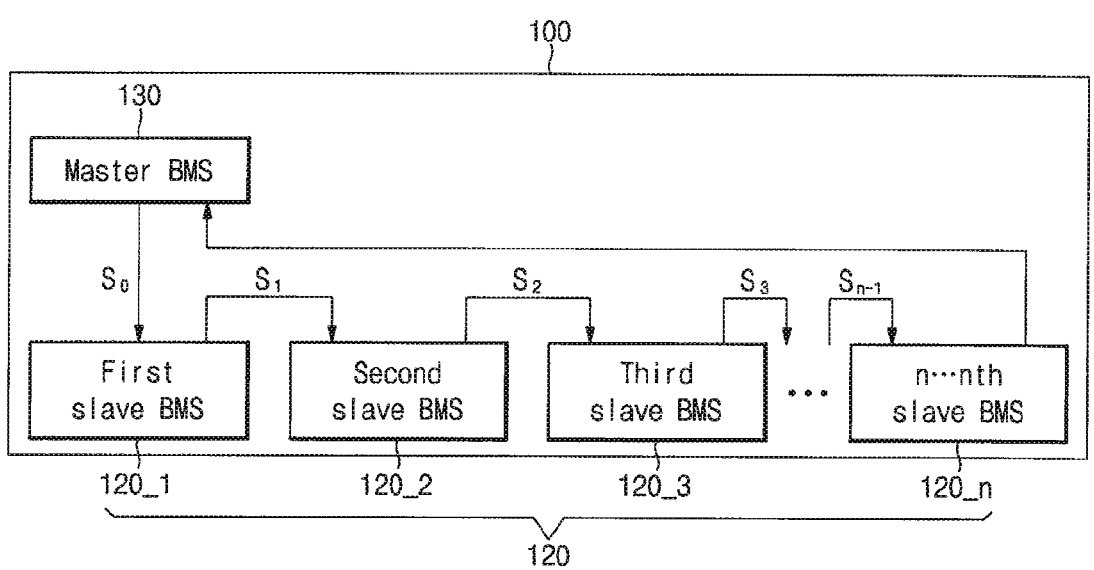
FIG. 2 is a conceptual diagram illustrating a connection relationship between battery management systems in the battery pack shown in FIG. 1.
Figure 3:
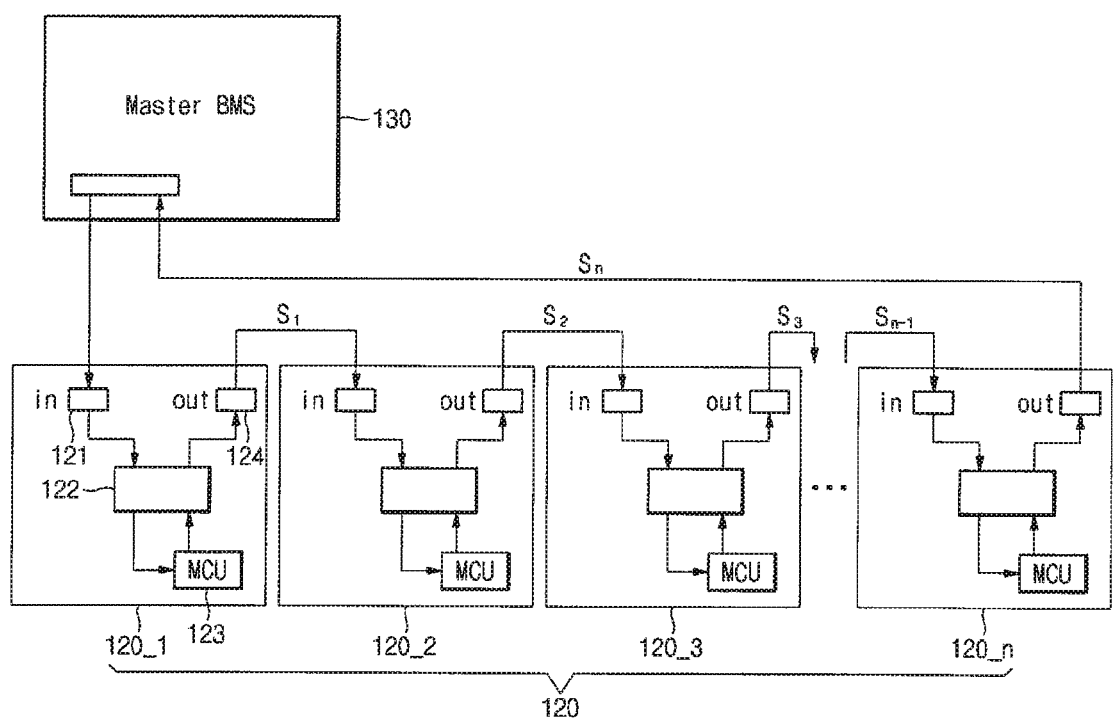
FIG. 3 is a schematic diagram illustrating a connection relationship between battery management systems in the battery pack shown in FIG. 1.

FIG. 2 is a conceptual diagram illustrating a connection relationship between BMSs in the battery pack shown in FIG. 1, and FIG. 3 is a schematic diagram illustrating a connection relationship between BMSs in the battery pack shown in FIG. 1.

Referring to FIGS. 2 and 3, the master BMS 130 is connected to the slave BMS assembly 120, and each of the slave BMSs 120_1 to 120_n of the slave BMS assembly 120 includes an input terminal 121, a communication unit 122, a main control unit 123, and an output terminal 124.

According to one embodiment, the slave BMSs 120_1 to 120_n and the master BMS 130 store information about input signals, internal reference values, and output signals according to the signal input/output order, as shown in Table 1.

TABLE 1

| Type | Input signal | Internal reference | Output signal |
|---|---|---|---|
| Master (130) | — | — | Trigger signal ($S_0$) |
| First slave BMS (120_1) | Trigger signal ($S_0$) | $S'_0$ | First signal ($S_1$) |
| Second slave BMS (120_1) | First signal ($S_1$) | $S'_1$ | Second signal ($S_2$) |
| (n − 1)th slave BMS (120_(n − 1)) | (n − 2)th signal ($S_{n-2}$) | $S'_{n-2}$ | (n − 1)th signal ($S_{n-1}$) |

TABLE 1-continued

| Type | Input signal | Internal reference | Output signal |
|---|---|---|---|
| nth slave BMS (120_n) | (n − 1)th signal ($S_{n-1}$) | $S'_{n-1}$ | nth signal ($S_n$) |
| Master BMS (130) | nth signal ($S_n$) | $S'_n$ | — |

According to one embodiment, the trigger signal $S_0$ and the first signal $S_1$ to nth signal $S_n$ are composed of different types of signals. For example, the signals may be signals having different frequencies or signals indicating intrinsic ID information of the respective BMSs 120 and 130.

According to one embodiment, the first signal $S_1$ may be an inversion signal of the trigger signal $S_0$, the second signal $S_2$ may be an inversion signal of the first signal $S_1$, the third signal $S_3$ may be an inversion signal of the second signal $S_2$, and the nth signal may be an inversion signal of the (n−1)th signal $S_{n-1}$.

The operation of each BMS will now be described in more detail. The master BMS 130 of the battery pack 100 is connected to the first slave BMS 120_1 and transmits the trigger signal $S_0$, which may be a preset signal.

The first slave BMS 120_1 receives the trigger signal $S_0$ through the input terminal 121 and transmits the received trigger signal $S_0$ to the communication unit 122. Here, the communication unit 122 of the slave BMS 120_1 may include a 2-channel isolator, thereby isolating the input signals and output signals.

The communication unit 122 may transmit the trigger signal $S_0$ to the main control unit 123, and the main control unit 123 may compare the trigger signal $S_0$ with a first internal reference value $S'_0$, to determine whether or not the trigger signal $S_0$ is equal to the first internal reference value $S'_0$. If the trigger signal $S_0$ is equal to the first internal reference value $S'_0$, the main control unit 123 applies a control signal to the communication unit 122. The communication unit 122 transmits the first signal $S_1$ to the second slave BMS 120_2 connected in proximity to the communication unit 122 through the output terminal 124.

In addition, if the trigger signal $S_0$ is not equal to the first internal reference value $S'_0$, that is, if the internal reference value of the corresponding slave BMS is set to a value different from the trigger signal $S_0$, it is determined that the first slave BMS 120_1 is erroneously connected.

The second slave BMS 120_2 compares the first signal $S_1$ with a preset reference value to be applied through the internal main controller unit 123, and if the first signal $S_1$ and the preset reference value are equal to each other, the second slave BMS 120_2 transmits the second signal $S_2$ to the third slave BMS 120_3 connected in proximity to the second slave BMS 120_2.

If the first signal $S_1$ is not equal to the reference value, because the reference value of the corresponding slave BMS 120_2 is set to a value different from the first signal $S_1$, it is determined that the second slave BMS 120_2 is erroneously connected.

The last connected nth slave BMS 120_n receives the (n−1)th signal $S_{n-1}$ from the (n−1)th slave BMS 120_(n−1), and compares the same with the reference value. If the (n−1)th signal $S_{n-1}$ is equal to the reference value, the nth slave BMS 120_n transmits the nth signal $S_n$ to the master BMS 130. The master BMS 130 may confirm that all of the battery modules 110 are normally connected.

Figure 4:
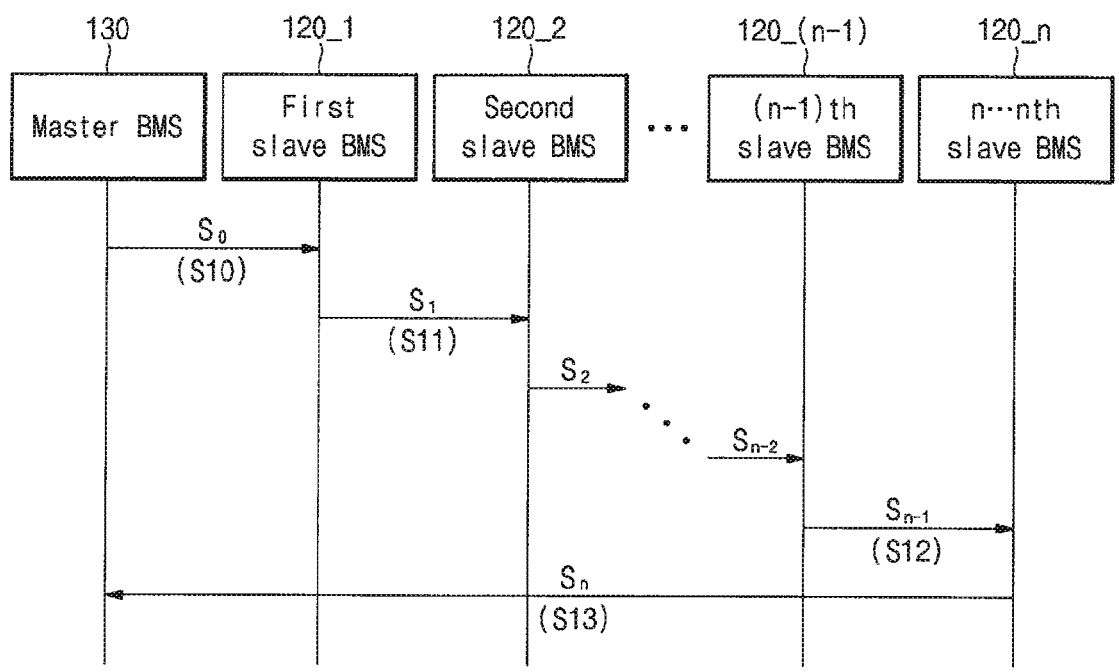
FIG. 4 is a diagram illustrating the flow of signals in a state in which battery modules are normally assembled in the battery management systems in the battery pack shown in FIG. 1.

FIG. 4 is a diagram illustrating the flow of signals in a state in which battery modules are normally assembled in the battery management systems in the battery pack shown in FIG. 1.

Referring to FIG. 4, in the battery management systems in the battery pack according to the embodiment of the present invention, the master BMS 130 transmits the trigger signal $S_0$ to the first slave BMS 120_1 (S10).

Next, the first slave BMS 120_1 compares the trigger signal $S_0$ to a reference value, and then transmits the first signal $S_1$ to the second slave BMS 120_2 (S11). The second slave BMS 120_2 compares the first signal $S_1$ with a reference value and transmits the second signal $S_2$ to the third slave BMS 120_3. In such a manner, signal transmission is performed.

The (n−1)th slave BMS(120_(n−1) transmits the (n−1)th signal $S_{n-1}$ to the nth slave BMS 120_n (S12).

The nth slave BMS 120_n compares the (n−1)th signal $S_{n-1}$ with a reference value, and if the (n−1)th signal $S_{n-1}$ is equal to the reference value, the nth slave BMS 120_n transmits the nth signal $S_n$ to the master BMS 130 (S13). The master BMS 130 compares the nth signal $S_n$ with a reference value and determines whether or not all of the battery modules 110 are properly connected.

Figure 5:
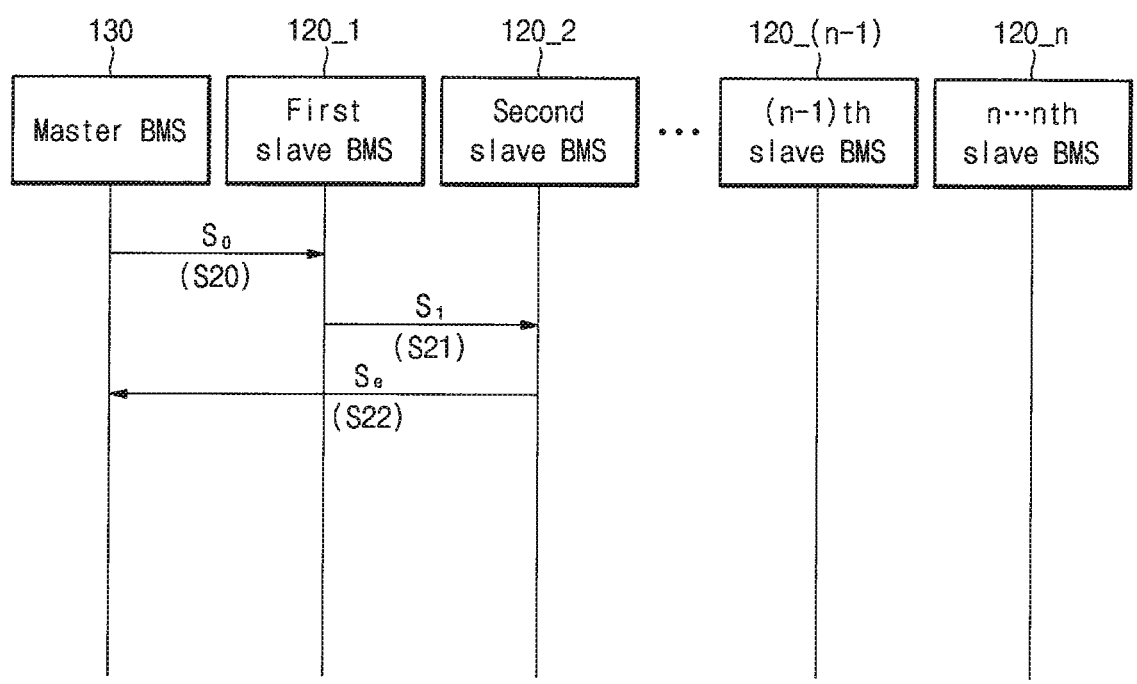
FIG. 5 is a diagram illustrating the flow of signals in a state in which battery modules are abnormally assembled in the battery management systems in the battery pack shown in FIG. 1.

FIG. 5 is a diagram illustrating the flow of signals in a state in which battery modules are abnormally assembled in the BMSs in the battery pack shown in FIG. 1.

FIG. 5 illustrates an example of erroneous connection between the second battery module 110 and the second slave BMS 120_2.

Referring to FIG. 5, in the management system of the battery pack according to an embodiment of the present invention, the master BMS 130 transmits the trigger signal $S_0$ to the first slave BMS 120_1 (S20).

Next, the first slave BMS 120_1 compares the trigger signal $S_0$ with a reference value and transmits the first signal $S_1$ to the second slave BMS 120_2 (S21).

Then, the second slave BMS 120_2 compares the first signal $S_1$ with a reference value. Here, if the second battery module 110 and the second slave BMS 120_2 are erroneously connected, the reference value stored in the second slave BMS 120_2 is different value from the first signal $S_1$. Therefore, the second slave BMS 120_2 determines that the first signal $S_1$ is different from the reference value and transmits an error signal $S_e$ to the master BMS 130 (S22).

Therefore, the master BMS 130 may determine that the second battery module 110 is erroneously connected with the slave BMS 120_2 and may inform the user of the erroneous connection.

Figure 6:
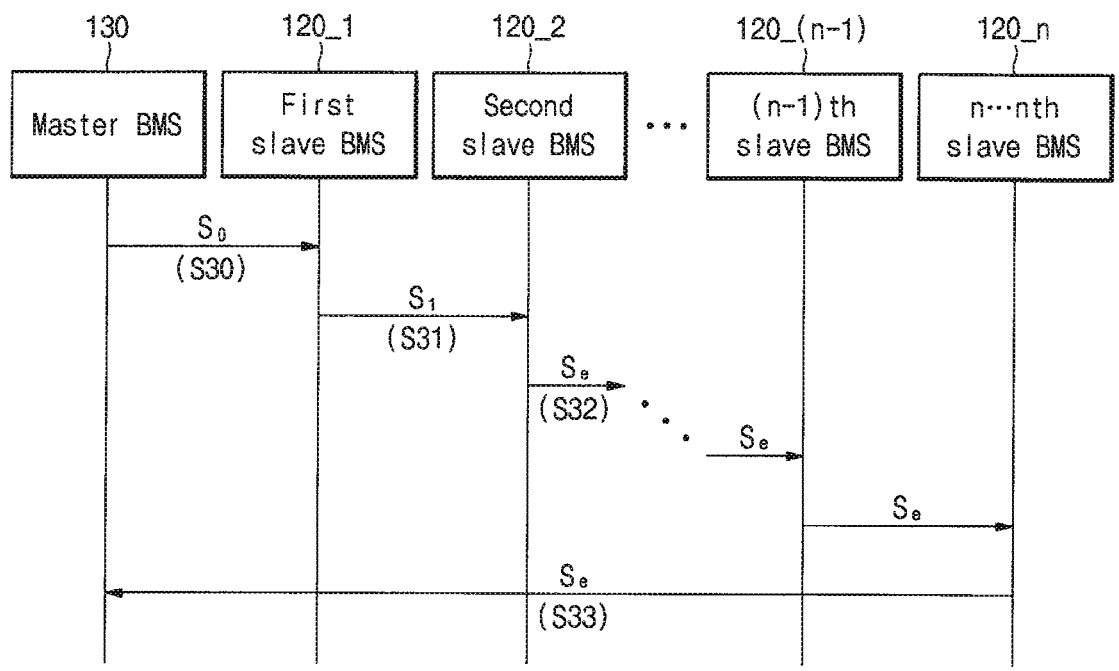
FIG. 6 is a diagram illustrating the flow of signals in a state in which battery modules are abnormally assembled in battery management systems in another battery pack according to another embodiment of the present invention.

FIG. 6 is a diagram illustrating the flow of signals in a state in which battery modules are abnormally assembled in BMSs in a battery pack according to another embodiment of the present invention.

FIG. 6 illustrates an example of erroneous connection between the second battery module 110 and the second slave BMS 120_2.

Referring to FIG. 6, in the management system of the battery pack according to the embodiment of the present invention, the master BMS 130 transmits the trigger signal $S_0$ to the first slave BMS 120_1 (S30).

Next, the first slave BMS 120_1 compares the trigger signal $S_0$ with a reference value and transmits the first signal $S_1$ to the second BMS 120_2 (S31).

Then, the second BMS 120_2 compares the first signal $S_1$ with a reference value. Here, if the second battery module 110 is erroneously connected to the second slave BMS 120_2, the reference value stored in the second slave BMS 120_2 is a value other than the first signal $S_1$. Therefore, the second BMS 120_2 determines that the first signal $S_1$ is different from the reference value and transmits the error signal $S_e$ to the third slave BMS 120_3. In addition, because the third to (n−1)th slave BMS 120_3 to 120_(n−1) also receive the error signal $S_e$ different from the reference values stored therein, the error signal $S_e$ is transmitted to the nth slave BMS 120_n (S32).

Because the error signal $S_e$ is different from the reference value s(n−1), the nth slave BMS 120_n transmits the error signal $S_e$ to the master BMS 130 (S33).

Therefore, the master BMS 130 determines that the second battery module 110 is erroneously connected with the slave BMS 120_2 and may inform the user of the erroneous connection.

Figure 7:
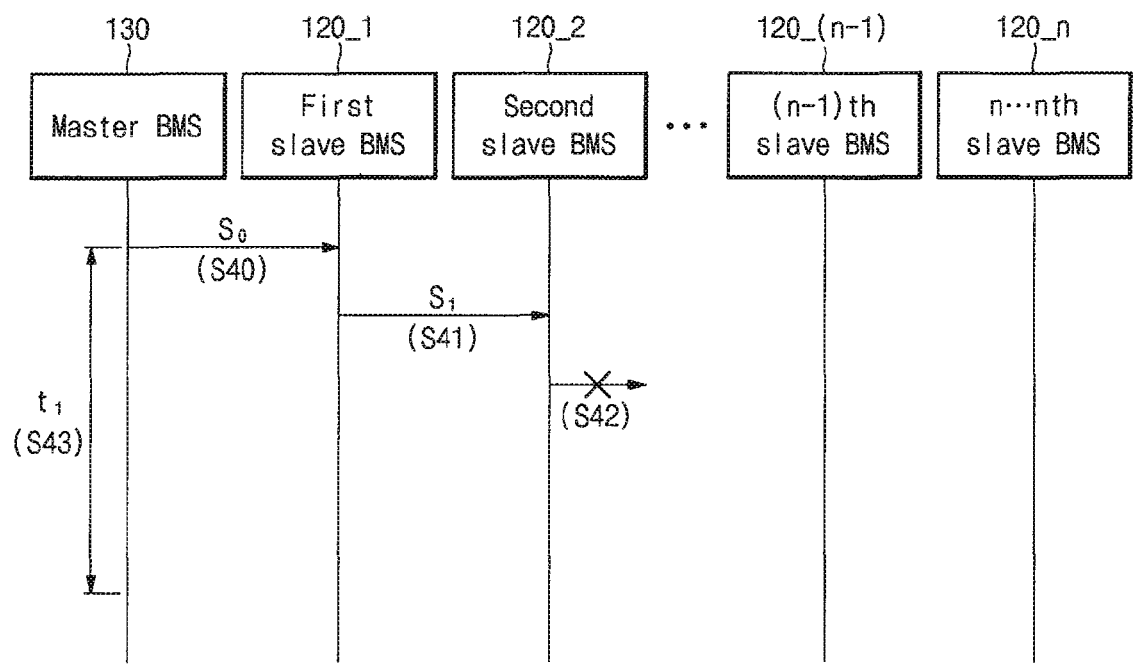
FIG. 7 is a diagram illustrating the flow of signals in a state in which battery modules are abnormally assembled in battery management systems in a battery pack according to still another embodiment of the present invention.

FIG. 7 is a diagram illustrating the flow of signals in a state in which battery modules are abnormally assembled in battery management systems in a battery pack according to still another embodiment of the present invention.

FIG. 7 illustrates an example of erroneous connection between the second battery module 110 and the second slave BMS 120_2.

Referring to FIG. 7, in the management system of the battery pack according to an embodiment of the present invention, the master BMS 130 transmits the trigger signal $S_0$ to the first slave BMS 120_1 (S40).

Next, the first slave BMS 120_1 compares the trigger signal $S_0$ with a reference value and transmits the first signal $S_1$ to the second BMS 120_2 (S41).

Then, the second BMS 120_2 compares the first signal $S_1$ with a reference value. If the second battery module 110 is erroneously connected to the second slave BMS $120\__2$, the reference value stored in the second slave BMS 120_2 is a value other than the first signal $S_1$. Therefore, the second BMS 120_2 determines that the first signal $S_1$ is different from the reference value and transmits no signal to the slave BMSs 120_3 to 120_n (S42).

After the trigger signal $S_0$ is applied for the first time, the master BMS 130 measures a reference time $t_1$ to check whether there is a signal received from the nth stave BMS 120_n within the reference time $t_1$. Because no signal is transmitted from the second BMS 120_2 and the BMSs 120_3 to 120_n, the master BMS 130 does not receive a signal within the reference time $t_1$.

Therefore, the master BMS 130 may determine that some of the battery modules 110 and the slave BMS assembly 120 are erroneously connected, and may inform the user of the erroneous connection.

Although exemplary embodiments of the present invention have been described in detail herein, it should be understood that many variations and modifications of the basic inventive concept herein described, which may appear to those skilled in the art, will still fail within the spirit and scope of the exemplary embodiments of the present invention as defined by the appended claims and their equivalents.

What is claimed is:

1. A battery pack, the battery pack comprising:
   n battery modules;
   n slave battery management systems corresponding to the n battery modules, the n slave battery management systems respectively and sequentially coupled to each other; and
   a master battery management system coupled to the n slave battery management systems,
   wherein the master battery management system is configured to apply a trigger signal to a first slave battery management system of the n slave battery management systems,
   wherein the first to (n−1)th slave battery management systems are configured to transmit the trigger signal and first to (n−1)th signals including different connection error order information for indicating whether the slave battery management systems are connected in order, which are different from each other, to a next slave battery management system of the n slave battery management systems,
   wherein an nth slave battery management system of the n slave battery management systems is configured to transmit an nth signal to the master battery management system, and
   wherein n is an integer greater than or equal to two.

2. The battery pack of claim 1, wherein the master battery management system is configured to compare the nth signal with a reference value and to determine the n battery modules are normally connected when the nth signal is equal to the reference value.

3. The battery pack of claim 1, wherein the master battery management system is configured to compare the nth signal with a reference value and to determine that the n battery modules are abnormally connected when the nth signal is not equal to the reference value.

4. The battery pack of claim 1, wherein the trigger signal and the first to nth signals have different frequencies.

5. The battery pack of claim 1, wherein the first to nth signals have intrinsic ID values for the respective first to nth slave battery management systems.

6. The battery pack of claim 1, wherein the first signal is an inversion signal of the trigger signal, and the second to nth signals are inversion signals of preceding signals.

7. A battery pack, the battery pack comprising:
   n battery modules;
   n slave battery management systems corresponding to the n battery modules, the n slave battery management systems respectively and sequentially coupled to each other; and
   a master battery management system coupled to the n slave battery management systems,
   wherein the master battery management system is configured to apply a trigger signal to a first slave battery management system of the n slave battery management systems,
   wherein the first to (n−1)th slave battery management systems are configured to transmit the trigger signal and first to (n−1)th signals, which are different from each other, to a next slave battery management system of the n slave battery management systems,
   wherein an nth slave battery management system of the n slave battery management systems is configured to transmit an nth signal to the master battery management system,
   wherein n is an integer greater than or equal to two,
   wherein the first slave battery management system is configured to store the trigger signal of the master battery management system as a reference value, and
   wherein the second to nth slave battery management systems are configured to store input signals to be applied from a preceding slave battery management system of the n slave battery management systems as reference values.

8. The battery pack of claim 7, wherein the first to nth slave battery management systems are configured to compare input signals applied from the master battery management system or the preceding slave battery management system with the reference values.

9. The battery pack of claim 8, wherein the first to nth slave battery management systems are configured transmit an error signal to the master battery management system when the input signals are not equal to the reference values.

10. The battery pack of claim 8, wherein when the input signals are not equal to the reference values, the first to (n−1)th slave battery management systems are configured to transmit an error signal to the next slave battery management system, and the nth slave battery management system connected at a last stage is configured to transmit the error signal to the master battery management system.

11. The battery pack of claim 8, wherein the first to (n−1)th slave battery management systems are configured to transmit no signal to the next slave battery management system when the input signals are not equal to the reference values.

12. The battery pack of claim 11, wherein after transmitting the trigger signal, the master battery management system is configured to measure a time duration and to determine that the battery modules are abnormally connected when no signal is received from the n slave battery management systems within a reference time.

* * * * *